(12) United States Patent
Bergemont

(10) Patent No.: US 6,498,084 B2
(45) Date of Patent: Dec. 24, 2002

(54) METHOD OF FORMING HIGH DENSITY EEPROM CELL

(75) Inventor: Albert Bergemont, Palo Alto, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/855,869

(22) Filed: May 14, 2001

(65) Prior Publication Data

US 2002/0168843 A1 Nov. 14, 2002

(51) Int. Cl.[7] .......................................... H01L 21/3205
(52) U.S. Cl. ...................................... 438/593; 438/257
(58) Field of Search ................................ 257/314, 315, 257/260, 336, 390; 438/258, 266, 269, 257, 260

(56) References Cited

U.S. PATENT DOCUMENTS 5,429,971 A * 7/1995 Yang ........................... 438/258
5,714,412 A * 2/1998 Liang et al. ................. 438/266
5,830,794 A * 11/1998 Kusunoki et al. ........... 438/266
5,986,931 A   11/1999 Caywood

* cited by examiner

Primary Examiner—Hoai Ho
Assistant Examiner—Thao P Le
(74) Attorney, Agent, or Firm—Blakely, Sokoloff, Taylor & Zafman LLP

(57) ABSTRACT

A memory cell formed on a substrate with a well having drain and source regions and a channel therebetween, a control gate with a first portion overlying a first region of the channel proximate the drain region and a second portion overlying a second region of the channel proximate the source region, and a floating gate with a first portion overlying the first control gate portion, a second portion overlying a third region of the channel between the first and second regions, and a third portion overlying the second control gate portion. The floating gate also includes a fourth portion that extends generally vertical from the first portion to the second portion of the floating gate, and a fifth portion that extends generally vertical from the second portion to the third portion of the floating gate. Dielectrics separate the control and floating gate from each other and the substrate.

20 Claims, 6 Drawing Sheets

METHOD OF FORMING HIGH DENSITY EEPROM CELL

FIELD OF THE INVENTION

This invention relates generally to semiconductor processing, and in particular, to a new and improved electrically erasable programmable read only memory (EEPROM) cell and method therefor.

BACKGROUND OF THE INVENTION

A typical electrically erasable programmable read only memory (EEPROM) cell comprises a p-substrate with an n-well having spaced apart drain and source regions. A current conducting channel is defined between the drain and source regions. A control gate is situated over a first portion of the channel and separated therefrom by a thin oxide. A floating gate is situated over a second portion of the channel and separated therefrom by a thin oxide. This thin oxide that separates the floating gate from the channel is typically termed in the art as the tunnel oxide or tunnel window, since this is the material that electrons tunnel through in programming the memory cell.

Typically, the performance of the typical memory cell depends on the alignment of the tunnel window with respect to the control gate. If the tunnel window is misaligned with the control gate, the performance of the memory cell may not meet the desired specification. Thus, a memory cell susceptible to misalignment errors generally translates into a relatively low yield. The susceptibility to misalignment errors of the tunnel window to the control gate may also affect the scalability of the device. If a memory cell is susceptible to misalignment errors, it generally becomes more difficult to scale the memory cell for other manufacturing technology.

Thus, there is a need for a EEPROM memory cell which has a tunnel window self aligned to the control gate and drain and source regions that are self-aligned with the control gate to improve the yield of EEPROM memory arrays and their scalability. In addition, there is a need for a tunnel window that can be made smaller for increasing the density of memory arrays. Such needs and others are met with the EEPROM memory cell and method therefor in accordance with the invention.

SUMMARY OF THE INVENTION

An aspect of the invention relates to a new and improved electrically erasable programmable read only memory (EEPROM) cell. The memory cell comprises a substrate with a well having drain and source regions a channel therebetween. The memory cell further comprises a control gate with a first portion overlying a first region of the channel adjacent to the drain region and a second portion overlying a second region of the channel adjacent to the source region. The memory cell includes first and second dielectrics to respectfully separate the first and second control gate portions from the first and second regions of the channel.

The memory cell of the invention further comprises a floating gate with a first portion overlying the first control gate portion, a second portion overlying a third region of the channel between the first and second regions, and a third portion overlying the second control gate portion. The floating gate also includes a fourth portion that extends generally vertical from the first portion to the second portion of the floating gate, and a fifth portion that extends generally vertical from the second portion to the third portion of the floating gate.

The memory cell includes a third dielectric that separates the second floating gate portion from the third region of the channel, a fourth dielectric that separates the first control gate portion from the first floating gate portion, and a fifth dielectric that separates the second control gate portion from the third floating gate portion. In addition, the memory cell comprises a first dielectric spacer that separates the first control gate portion from the fourth floating gate portion, and a second dielectric spacer that separates the second control gate portion from the fifth floating gate portion.

In the exemplary embodiment, the floating and control gates are formed of doped poly crystalline silicon ("polysilicon"), the first, second and third dielectrics are formed of thermally-grown silicon dioxide ($SiO_2$), the fourth and fifth dielectrics are formed of an oxide-nitride-oxide (ONO) stack or optionally an oxide-nitride-oxide-nitride (ONON) stack, and the first and second dielectric spacers are formed of a thermally-grown silicon dioxide ($SiO_2$) sub-spacer and a silicon nitride ($Si_3N_4$) sub-spacer. The substrate may be doped with p-type dopant, the well may be doped with n-type dopant, and the drain and source region may be doped with p-type dopant. Alternatively, the substrate may be doped with n-type dopant, the well may be doped with p-type dopant, and the drain and source region may be doped with n-type dopant.

Another aspect of the invention relates to a method of forming an EEPROM memory cell. Other aspects, features and techniques of the invention will become apparent to one skilled in the relevant art in view of the following detailed description of the invention.

DETAILED DESCRIPTION OF THE INVENTION

Figure 1A:
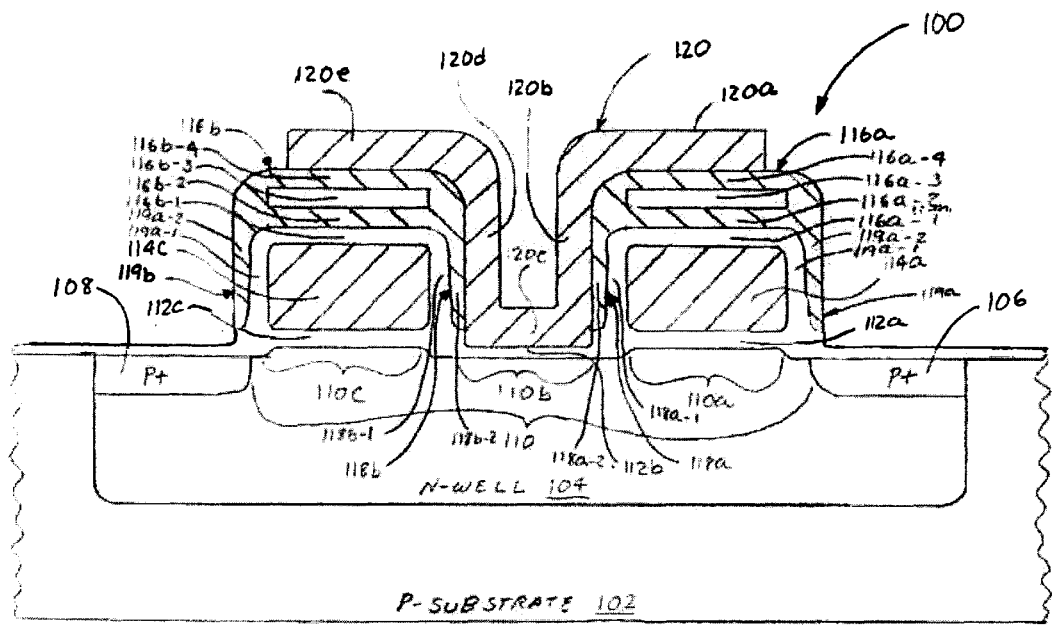
FIG. 1A illustrates a cross-sectional view (along line 1A—1A shown in FIG. 2) of an electrical erasable read only memory (EEPROM) cell in accordance with the invention.

FIG. 1A illustrates a cross-sectional view (along line 1A—1A shown in FIG. 2) of an electrical erasable read only memory (EEPROM) cell 100 in accordance with the invention. The memory cell 100 comprises a p-doped substrate 102, an n-well 104 formed within the p-doped substrate 102, a p+ doped drain region 106 formed within the n-well 104, and a p+ doped source region 108 formed within the n-well 104 and spaced apart from the drain region 106 to define a channel 110 therebetween. It shall be understood that substrate 102, n-well 104, drain region 106, and source region 108 may be doped with the opposite conductivity, i.e. the substrate 102 may be n-doped, the well 104 may be p-doped, and the drain and source regions 106 and 108 may be n-doped.

The EEPROM memory cell 100 further comprises a control gate 114 having a first portion 114a formed over a corresponding first portion 110a of the channel 110 adjacent to the drain region 106, and a second portion 114c formed over a corresponding third portion 110c of the channel 110 adjacent to the source region 108. A dielectric 112a separates the control gate portion 114a from the channel portion 110a, and a dielectric 112c separates the control gate portion 114c from the channel portion 110c. In the exemplary embodiment, the control gate 114 may be formed of doped polycrystalline silicon ("polysilicon") and the dielectrics 112a and 112c may be formed of thermally-grown silicon dioxide ($SiO_2$).

The EEPROM memory cell 100 additionally comprises a floating gate 120 having a first portion 120a situated over the first portion 114a of the control gate 114, a third portion 120c situated over a second portion 110b of the channel 110, and a fifth portion 120e situated over the second portion 114c of the control gate 114. The floating gate 120 further comprises a second portion 120b that extends generally vertical from the first portion 120a to the third portion 120c of the floating gate 120, and a fourth portion 120d that extends generally vertical from the third portion 120c to the fifth portion 120e of the floating gate 120.

The EEPROM memory cell 100 also comprises a dielectric 116a that separates the first portion 120a of the floating gate 120 from the first portion 114a of the control gate 114, and a dielectric 116b that separates the fifth portion 120e of the floating gate 120 from the second portion 114c of the control gate 114. Additionally, the EEPROM memory cell 100 comprises a dielectric 112b that separates the third portion 120c of the floating gate 120 from the second portion 110b of the channel 110. Further, the EEPROM memory cell 100 comprises a dielectric spacer 118a that separates the second portion 120b of the floating gate 120 from the first portion 114a of the control gate electrode 114, and a dielectric spacer 118b that separates the fourth portion 120d of the floating gate 120 from the second portion 114b of the control gate electrode 114. Also, the EEPROM 110 may also comprise dielectric spacers 119a–b covering the sides of the control gate electrode portions 114a–b opposite the floating gate 120.

In the exemplary embodiment, the floating gate electrode 120 may be formed of doped polysilicon material, the dielectrics 116a–b may be formed of an oxide-nitride-oxide stack comprising respectively lower silicon dioxide ($SiO_2$) layers 116a–1 and 116b–1, silicon nitride ($Si_3N_4$) layers 116a–2 and 116b–2, and upper silicon dioxide ($SiO_2$) layers 116a–3 and 116b–3. Optionally, the dielectrics 116a–b may further respectively include upper silicon nitride ($Si_3N_4$) layers 116a–4 and 116b–4. The dielectric 112b may be formed of thermally-silicon dioxide ($SiO_2$).

Also in the exemplary embodiment, the dielectric spacers 118a–b may be respectively formed of thermally-grown silicon dioxide ($SiO_2$) sub-spacers 118a–1 and 118b–1 adjacent to respective portions 114a–b of control gate 114 and silicon nitride ($Si_3N_4$) sub-spacers 118a–2 and 118b–2 adjacent to the respective portions 120b and 120d of the floating gate 120. Similarly, the dielectric spacers 119a–b may also be respectively formed of inner thermally-grown silicon dioxide ($SiO_2$) sub-spacers 119a–1 and 119b–1 and outer silicon nitride ($Si_3N_4$) sub-spacers 119a–2 and 119b–2. The thermally-grown silicon dioxide ($SiO_2$) sub-spacers (118a–1 and 119a–1) and (118b–1 and 119b–1) may be formed continuously with respective lower silicon dioxide ($SiO_2$) layers 116a–1 and 116b–1. Also, the silicon nitride ($Si_3N_4$) sub-spacers (118a–2 and 119a–2) and (118b–2 and 119b–2) may be formed continuously with respective lower and upper silicon nitride ($Si_3N_4$) layers (116a–2 and 116a–4) and (116b–2 and 116b–4).

Figure 1B:
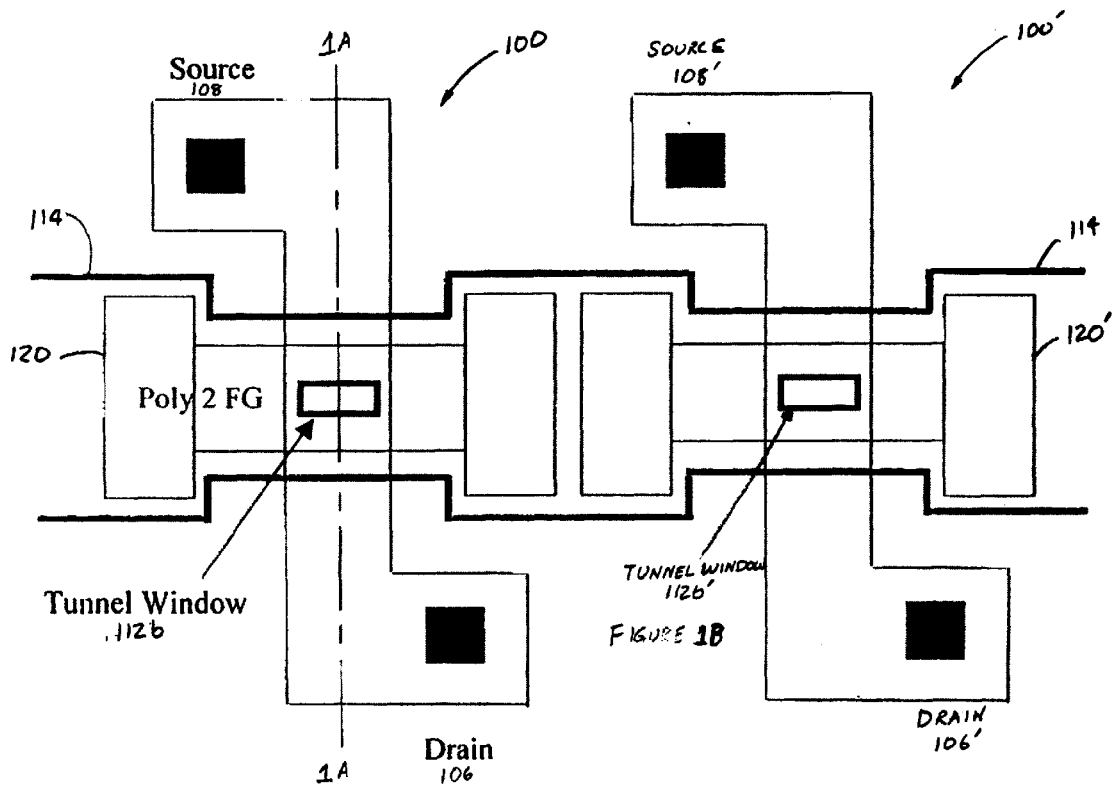
FIG. 1B illustrates a top view of the exemplary EEPROM memory cell adjacent to another EEPROM memory cell in accordance with the invention.

FIG. 1B illustrates a top view of the exemplary EEPROM memory cell 100 adjacent to another EEPROM memory cell 100' in accordance with the invention. As illustrated, the tunnel oxide 112b (or "tunnel window", the region where electrons tunnel through from the channel 110 to the floating gate 120) comprises an area, instead of an edge like in many prior art memory cells. This makes the EEPROM memory cell 100 less sensitive to alignment errors. In addition, as it will be explained in further detail below with regard to an exemplary method of forming the EEPROM memory cell in accordance with the invention, the forming of the tunnel oxide 112b is self-aligned with the forming of the control gate portions 114a–b. This also makes the EEPROM memory cell less susceptible to alignment errors. The control gate 114 extends continuous along a row of cells, as shown in FIG. 1B common to both adjacent cells 100 and 100'. The following describes an exemplary method of forming the EEPROM memory cell 100 of the invention.

Figure 2A:
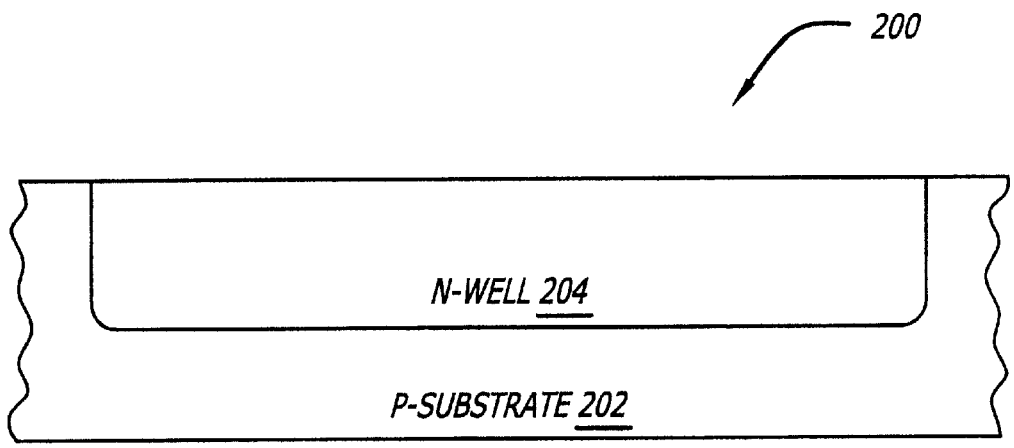
FIG. 2A illustrates a cross-sectional view of an exemplary semiconductor device at a step of an exemplary method of forming an EEPROM memory cell in accordance with the invention.

FIG. 2A illustrates a cross-sectional view of an exemplary semiconductor device 200 at a step of an exemplary method of forming an EEPROM memory cell in accordance with the invention. At this step, the semiconductor device 200 comprises a p-doped silicon substrate 202 and an n-well 204 formed within the substrate 202. As previously discussed, it shall be understood that the substrate 202 and the well 204 can be doped with the opposite polarity, i.e. the substrate 202 can be doped with n-type dopants and the well 204 can be doped with p-type dopants.

Figure 2B:
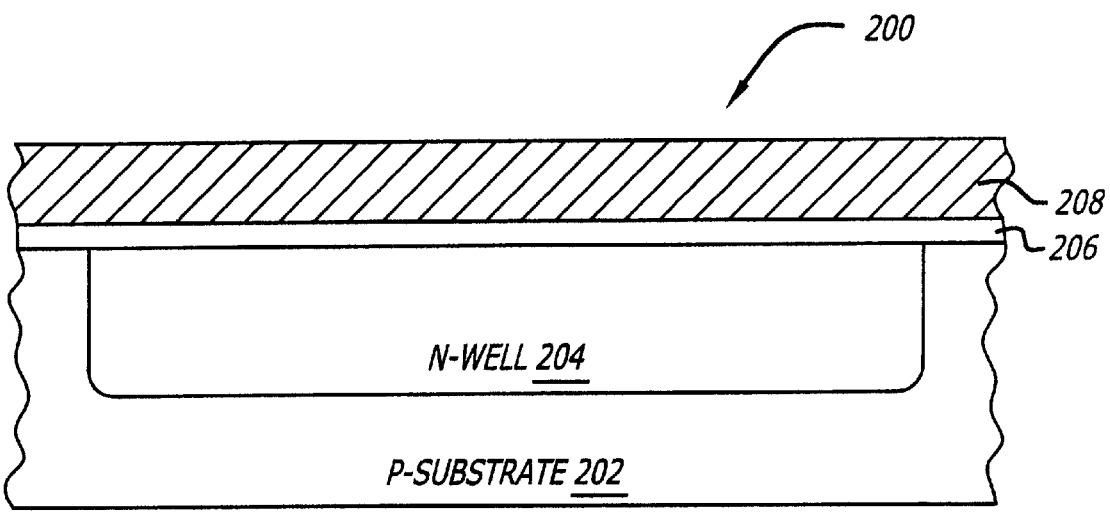
FIG. 2B illustrates a cross-sectional view of the exemplary semiconductor device at a subsequent step of the exemplary method of forming an EEPROM memory cell in accordance with the invention.

FIG. 2B illustrates a cross-sectional view of the exemplary semiconductor device 200 at a subsequent step of the exemplary method of forming an EEPROM memory cell in accordance with the invention. At this subsequent step, a layer of dielectric material 206 is formed over the p-substrate 202. In the exemplary method, the dielectric material 206 is comprised of thermally-grown silicon dioxide ($SiO_2$) with a thickness ranging from about 250 to 300 Angstroms. Also, a doped poly crystalline silicon ("polysilicon") layer 208 is formed over the silicon dioxide ($SiO_2$) layer 206. The doped polysilicon layer 208 may be doped in-situ while the polysilicon material is being deposited, or may be doped after the polysilicon material has been deposited. The doped polysilicon layer 208 may be deposited to a thickness of about 3000 Angstroms.

Figure 2C:
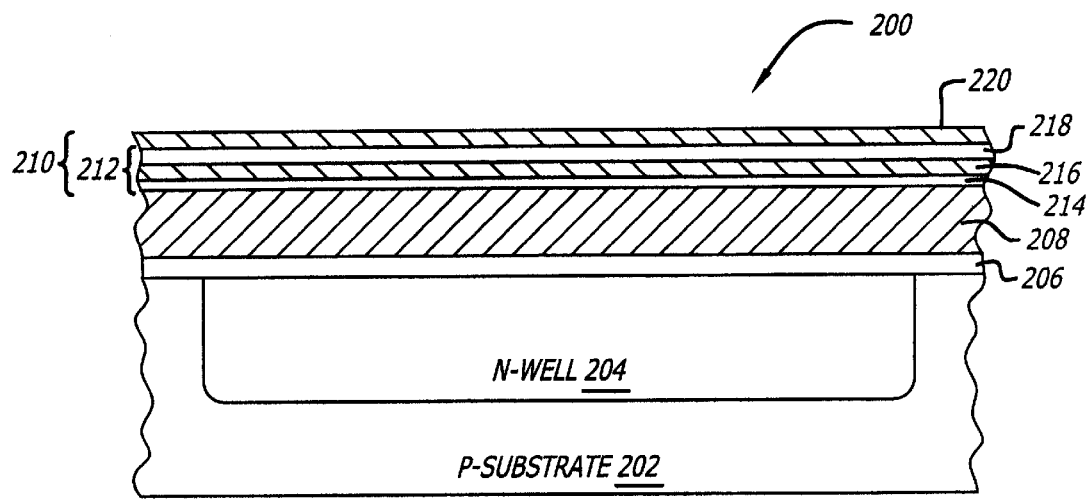
FIG. 2C illustrates a cross-sectional view of the exemplary semiconductor device at another subsequent step of the exemplary method of forming an EEPROM memory cell in accordance with the invention.

FIG. 2C illustrates a cross-sectional view of the exemplary semiconductor device 200 at another subsequent step of the exemplary method of forming an EEPROM memory cell in accordance with the invention. In this subsequent step, a second layer of dielectric material 210 is formed over the doped polysilicon layer 208. In the exemplary method, the second dielectric layer 210 comprises an oxide-nitride-oxide (ONO) stack 212. The oxide-nitride-oxide (ONO) stack 212, in turn, comprises a lower layer of silicon dioxide ($SiO_2$) 214 deposited over the doped polysilicon layer 208 to a thickness of about 50 to 100 Angstroms, a layer of silicon nitride ($Si_3N_4$) 216 deposited over the lower silicon dioxide ($SiO_2$) layer 214 to a thickness of about 50 to 100 Angstroms, and an upper layer of silicon dioxide ($SiO_2$) 218 deposited over the silicon nitride ($Si_3N_4$) layer to a thickness of about 50 to 100 Angstroms.

As an option, another layer of silicon nitride ($Si_3N_4$) 220 may be deposited over the silicon dioxide ($SiO_2$) layer 218 to a thickness of about 50 to 100 Angstroms. This second silicon nitride ($Si_3N_4$) layer 220 protects the underlying silicon dioxide ($SiO_2$) layer 218 from erosion due to subsequent cleaning steps.

Figure 2D:
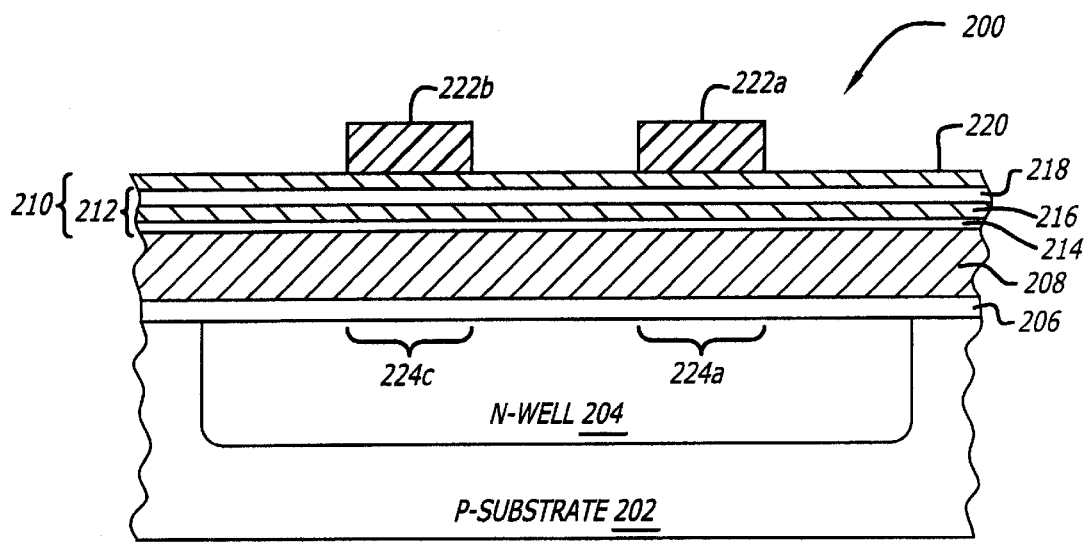
FIG. 2D illustrates a cross-sectional view of the exemplary semiconductor device at another subsequent step of the exemplary method of forming an EEPROM memory cell in accordance with the invention.

FIG. 2D illustrates a cross-sectional view of the exemplary semiconductor device 200 at another subsequent step of the exemplary method of forming an EEPROM memory cell in accordance with the invention. In this subsequent step, a mask layer 222 is formed over the dielectric layer 210. In the exemplary method, the mask layer 222 has a portion 222a overlying a region 224a of the n-well 204 and another portion 222b overlying another region 224c of the n-well 204. The mask layer 222 may be formed of photo resist material or other materials that can serve as a mask for a subsequent process of etching the dielectric 210, the doped polysilicon 208, and at least partially the dielectric 206.

Figure 2E:
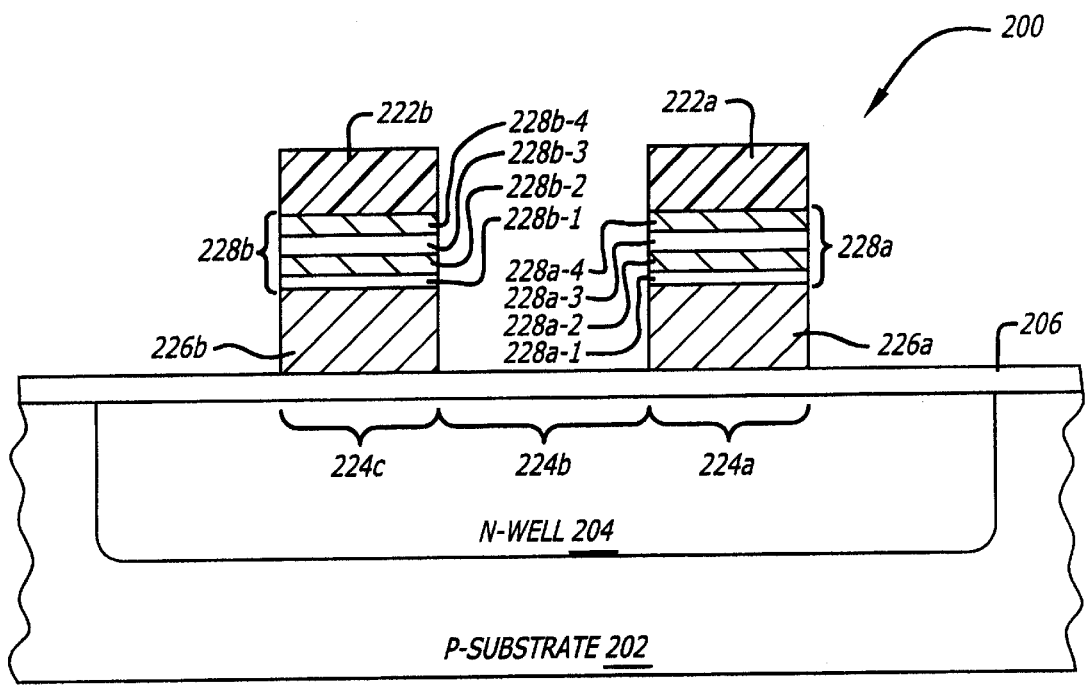
FIG. 2E illustrates a cross-sectional view of the exemplary semiconductor device at another subsequent step of the exemplary method of forming an EEPROM memory cell in accordance with the invention.

FIG. 2E illustrates a cross-sectional view of the exemplary semiconductor device 200 at another subsequent step of the exemplary method of forming an EEPROM memory cell in accordance with the invention. In this subsequent step, the dielectric 210, the doped polysilicon 214, and at least partially the dielectric 206 are etched off except under the masks 222a and 222b. This forms a control gate 226 having a portion 226a overlying the region 224a of the n-well 204 and another portion 226b overlying the region 224c of the n-well 204. Dielectrics 228a–b are formed over the respective portions 226a–b of the control gate 226. The dielectrics 228a–b respectively comprise lower silicon dioxide ($SiO_2$) layers 228a–1 and 228b–1, silicon nitride ($Si_3N_4$) layers 228a–2 and 228b–2, and upper silicon dioxide ($SiO_2$) layers 228a–3 and 228b–3. Optionally, the dielectrics 228a–b respectively may further comprise upper silicon nitride ($Si_3N_4$) layers 228a–and 228b–4.

Figure 2F:
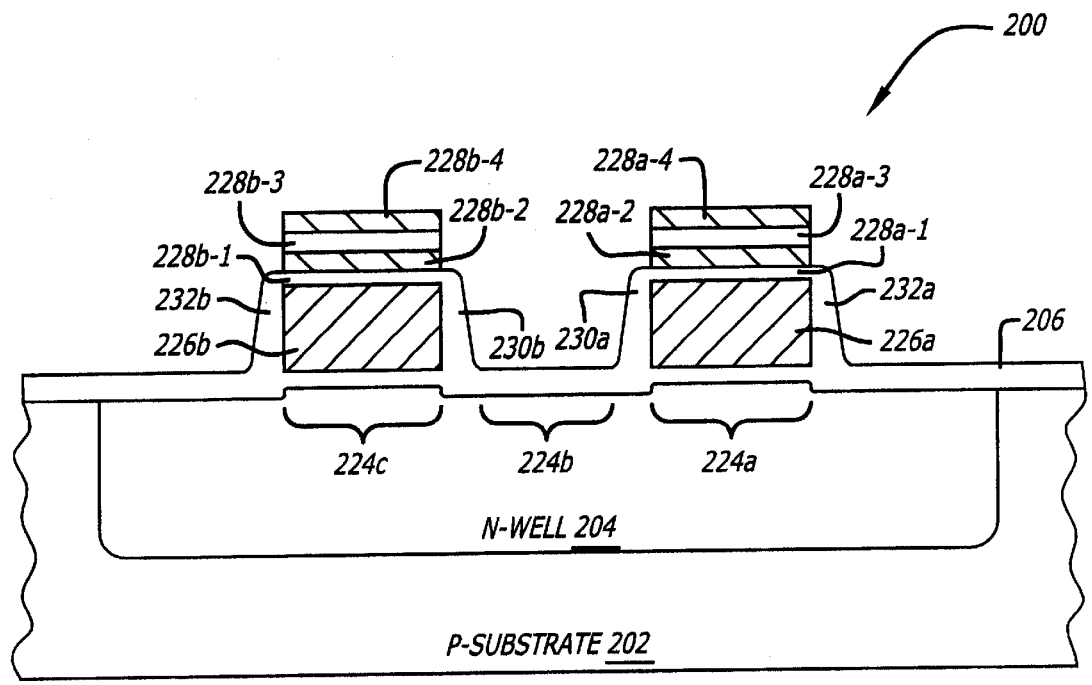
FIG. 2F illustrates a cross-sectional view of the exemplary semiconductor device at another subsequent step of the exemplary method of forming an EEPROM memory cell in accordance with the invention.

FIG. 2F illustrates a cross-sectional view of the exemplary semiconductor device 200 at another subsequent step of the exemplary method of forming an EEPROM memory cell in accordance with the invention. In this subsequent step, the mask layer 222 is striped off and the semiconductor device 200 is subjected to a cleaning process. Then, the semiconductor device 200 is subjected to an oxidation process to oxidize the side regions of the control gate polysilicon portions 226a–b and the sides of the lower silicon dioxide ($SiO_2$) layers 228a–1 and 228b–1. This process forms thermally grown silicon dioxide ($SiO_2$) dielectric spacers 230a–b on the respective tunnel sides of the control gate portions 226a–b. This process also forms thermally grown silicon dioxide ($SiO_2$) dielectric spacers 232a–b on the respective non-tunnel sides of the control gate portions 226a–b. The dielectric spacers 230 and 232 may be grown to a lateral thickness of about 400 to 500 Angstroms. The silicon dioxide ($SiO_2$) spacers (230a and 232a) and (230b and 232b) may be formed continuously with respective lower silicon dioxide ($SiO_2$) layers 228a–1 and 228b–1.

Figure 2G:
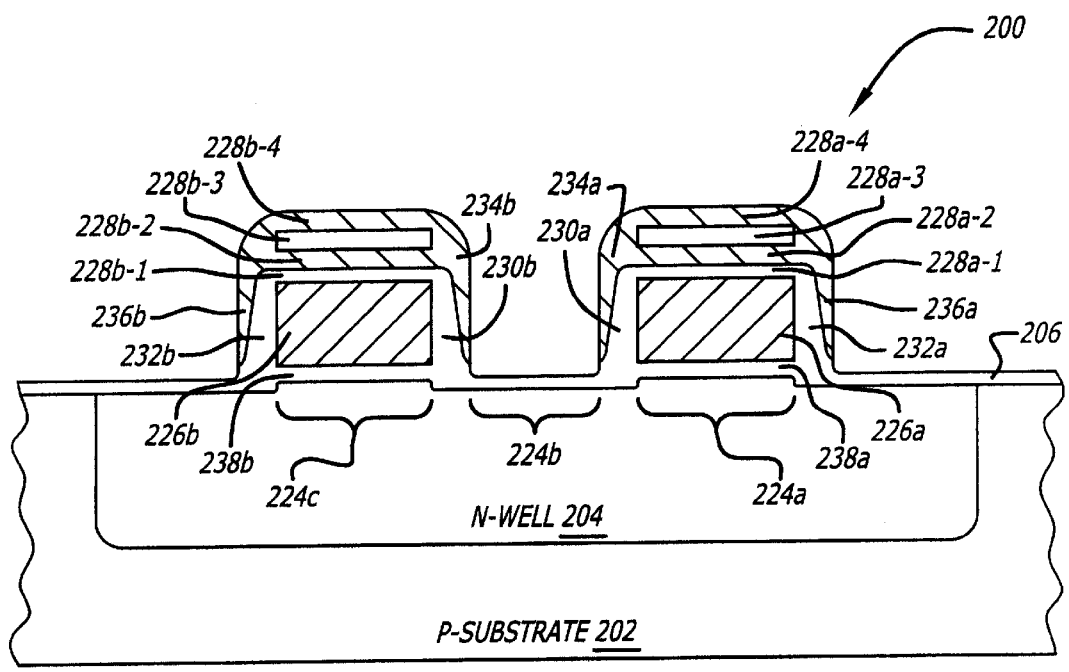
FIG. 2G illustrates a cross-sectional view of the exemplary semiconductor device at another subsequent step of the exemplary method of forming an EEPROM memory cell in accordance with the invention.

FIG. 2G illustrates a cross-sectional view of the exemplary semiconductor device 200 at another subsequent step of the exemplary method of forming an EEPROM memory cell in accordance with the invention. In this step, additional silicon nitride ($Si_3N_4$) dielectric spacers 234a–b are formed on the respective tunnel sides of the silicon dioxide ($SiO_2$) spacers 230a–b. Also, additional silicon nitride ($Si_3N_4$) dielectric spacers 236a–b are formed on the respective non-tunnel sides of the silicon dioxide ($SiO_2$) spacers 232a–b. The silicon nitride ($Si_3N_4$) spacers (234a and 236a) and (234b and 236b) may be formed continuously with respective lower and upper silicon nitride ($Si_3N_4$) layers (228a–2 and 228a–4) and (228b–2 and 228b–4).

Figure 2H:
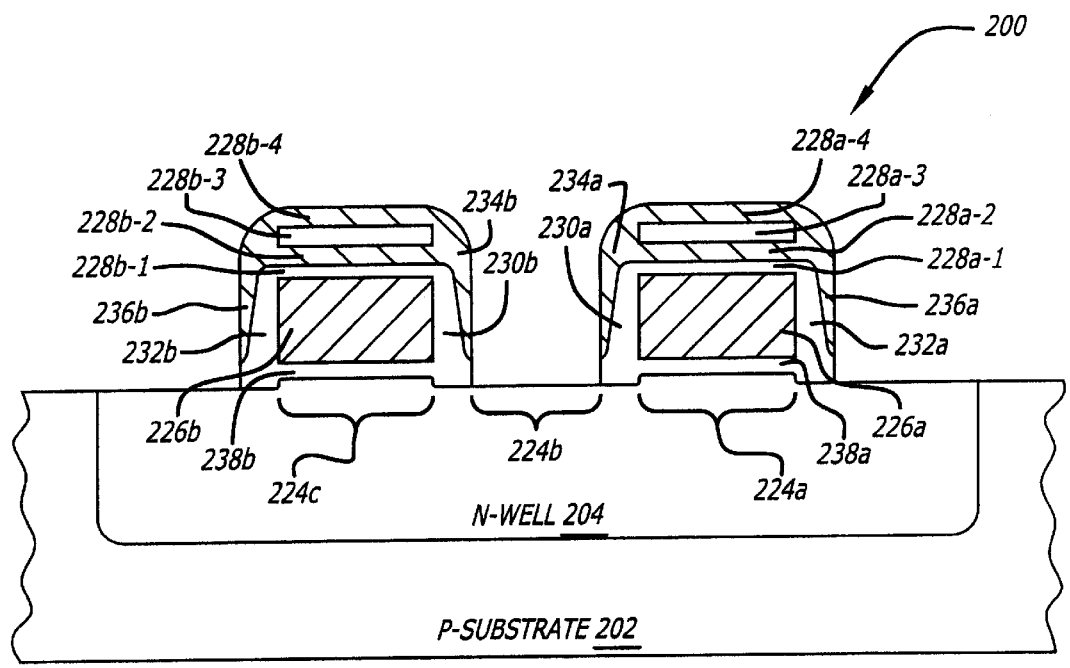
FIG. 2H illustrates a cross-sectional view of the exemplary semiconductor device at another subsequent step of the exemplary method of forming an EEPROM memory cell in accordance with the invention.

FIG. 2H illustrates a cross-sectional view of the exemplary semiconductor device 200 at another subsequent step of the exemplary method of forming an EEPROM memory cell in accordance with the invention. In this step, the silicon dioxide ($SiO_2$) dielectric layer 206 is etched off to expose the top surface of the substrate 202, except the regions underlying the control gate portions 226a–b and their respective spacers 230a–b, 232a–b, 234a–b and 236a–b. This forms silicon dioxide ($SiO_2$) dielectrics 238a–b underlying the respective control gate portions 226a–b and their respective spacers 230a–b, 232a–b, 234a–b and 236a–b.

Figure 2I:
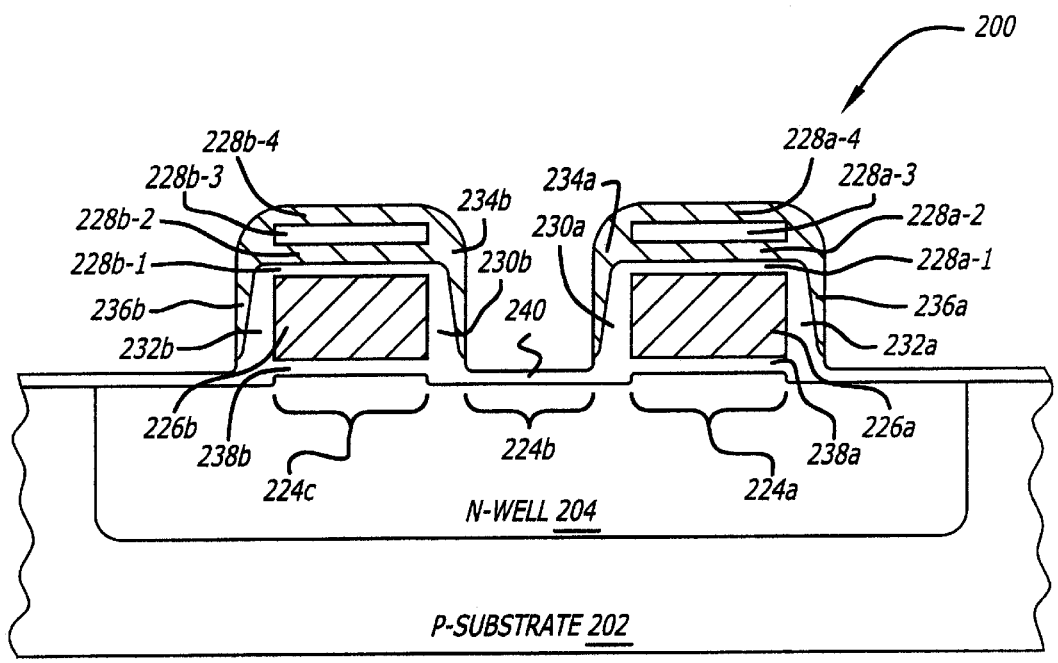
FIG. 2I illustrates a cross-sectional view of the exemplary semiconductor device at another subsequent step of the exemplary method of forming an EEPROM memory cell in accordance with the invention.

FIG. 2I illustrates a cross-sectional view of the exemplary semiconductor device 200 at another subsequent step of the exemplary method of forming an EEPROM memory cell in accordance with the invention. In this step, the semiconductor device 200 undergoes an oxidation process to grow a silicon dioxide ($SiO_2$) dielectric 240 above the region 224b of the n-well 204. This silicon dioxide ($SiO_2$) dielectric 240 is referred to in the art as the "tunnel oxide" since electrons tunnel through this material during programming of the memory cell 200. In the exemplary method, the silicon dioxide ($SiO_2$) dielectric 240 may be grown to a thickness of about 80 to 100 Angstroms.

Figure 2J:
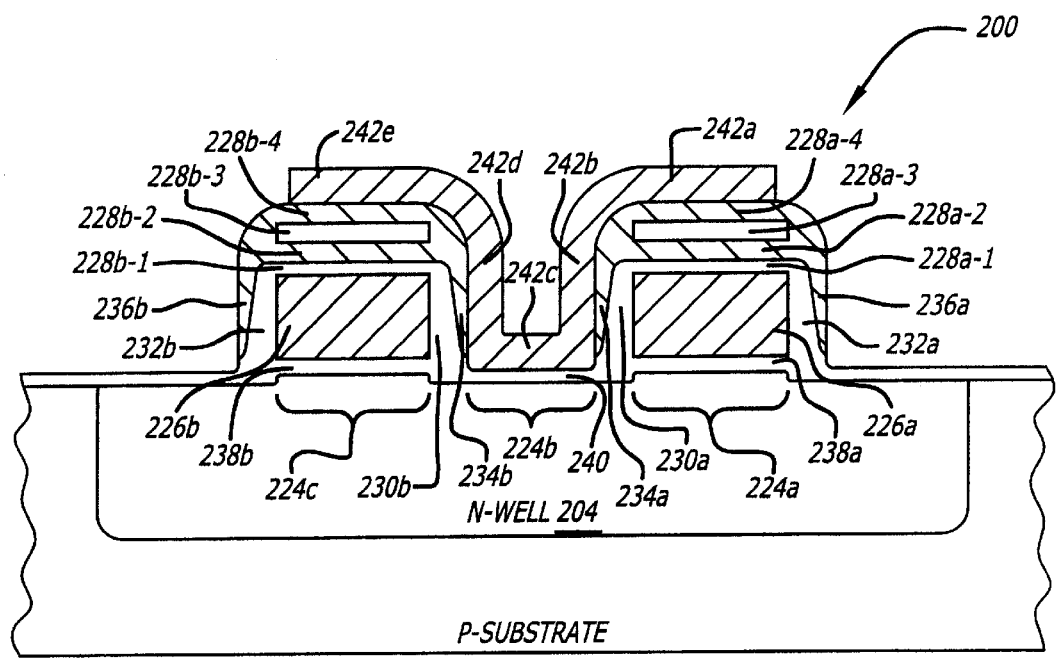
FIG. 2J illustrates a cross-sectional view of the exemplary semiconductor device at another subsequent step of the exemplary method of forming an EEPROM memory cell in accordance with the invention.

FIG. 2J illustrates a cross-sectional view of the exemplary semiconductor device 200 at another subsequent step of the exemplary method of forming an EEPROM memory cell in accordance with the invention. In this step, a floating gate 242 is formed by depositing polysilicon material and subsequently etching to form a first portion 242a overlying the first portion 226a of the control gate 226 and dielectric 228a, a third portion 242c overlying the region 224b of the channel 224 and the tunnel oxide 240, and a fifth portion 242e overlying the second portion 226b of the control gate 226 and dielectric 228b. Additionally, this process also forms a second portion 242b of the floating gate 242 that extends generally vertical from the first portion 242a to the third portion 242c of the floating gate 242, and a fourth portion 242d of the floating gate 242 that extends generally vertical from the third portion 242c to the fifth portion 242e of the floating gate 242. The doped polysilicon layer 242 may be doped in-situ while the polysilicon material is being deposited, or may be doped after the polysilicon material has been deposited. The doped polysilicon layer 242 may be deposited to a thickness of about 3000 Angstroms. After this step, the drain and source regions as shown in FIG. I may be formed in a self-aligned manner with the control gate portion 226a–b.

In the foregoing specification, the invention has been described with reference to specific embodiments thereof It will, however, be evident that various modifications and changes may be made thereto without departing from the broader spirit and scope of the invention. The specification and drawings are, accordingly, to be regarded in an illustrative rather than a restrictive sense.

It is claimed:

1. A method of forming a memory cell, comprising:
   providing a substrate having a well;
   forming a first dielectric layer over said substrate;
   forming a doped polysilicon layer over said first dielectric layer;
   forming a second dielectric layer over said doped polysilicon layer;
   forming a mask layer over said second dielectric layer, wherein a first portion of said mask layer overlies a first region of said well and a second portion of said mask layer overlies a second region of said well, wherein a third region of said well lies between said first and second regions of said well;
   removing said first dielectric layer and said doped polysilicon layer except under said first and second portions of said mask layer, wherein the remaining polysilicon layer define first and second control gate portions respectively overlying said first and second regions of said well, and wherein the remaining second dielectric layer define first and second dielectrics respectively overlying said first and second control gate portions;
   removing said mask layer;
   forming first and second dielectric spacers on respective tunnel sides of said first and second control gate;
   removing at least a portion of said first dielectric layer overlying said third region of said well;
   forming a third dielectric over said substrate above said third region of said well; and
   forming a floating gate having a first portion over said first dielectric, a second portion over said third dielectric, a third portion over said second dielectric, a fourth portion extending generally vertical from said first portion to said second portion of said floating gate, and a fifth portion extending generally vertical from said second portion to said third portion of said floating gate.

2. The method of claim 1, wherein said substrate is doped with p-type dopant and said well is doped with n-type dopant.

3. The method of claim 1, wherein said substrate is doped with n-type dopant and said well is doped with p-type dopant.

4. The method of claim 1, wherein forming said doped polysilicon layer comprises doping in situ polysilicon material while it is being deposited.

5. The method of claim 1, wherein forming said doped polysilicon layer comprises depositing polysilicon material and then subsequently doping said polysilicon material.

6. The method of claim 1, wherein forming said mask layer comprises depositing a layer of photo resist and then subsequently developing said photo resist layer to form said mask layer.

7. The method of claim 1, wherein forming said first and second dielectric spacers comprises oxidizing respective tunnel sides of said first and second control gate portions to respectively form first and second thermally-grown silicon dioxide ($SiO_2$) subspacers.

8. The method of claim 7, wherein forming said first and second dielectrics further comprises forming first and second silicon nitride ($Si_3N_4$) sub-spacers adjacent to said first and second thermally-grown silicon dioxide ($SiO_2$) sub-spacers.

9. The method of claim 1, wherein forming said third dielectric comprises thermally growing a silicon dioxide ($SiO_2$) on a surface of said substrate.

10. The method of claim 1, wherein forming said floating gate comprises depositing polysilicon material and then subsequently patterning said polysilicon material to form said floating gate.

11. A method of forming a memory cell, comprising:
    forming spaced-apart drain and source regions within a substrate, wherein a channel is defined between said drain and source regions;
    forming a first control gate over a first region of said channel adjacent to said drain region;
    forming a second control gate over a second region of said channel adjacent to said source region; and
    forming a floating gate having a first portion situated above said first control gate, a second portion situated over a third region of said channel between said first and second regions, and a third portion situated above said second control gate.

12. The method of claim 11, wherein said substrate is doped with p-type dopant.

13. The method of claim 11, wherein said substrate is doped with n-type dopant.

14. The method of claim 11, wherein forming said first and second control gates and/or said floating gate comprises doping in situ polysilicon material while it is being deposited.

15. The method of claim 11, wherein forming said first and second control gates and/or said floating gate comprises depositing polysilicon material and then subsequently doping said polysilicon material.

16. The method of claim 11, further comprising forming first and second dielectric spacers respectively between said first and second control gates and said second portion of said floating gate.

17. The method of claim 16, wherein forming said first and second dielectric spacers comprises oxidizing respective tunnel sides of said first and second control gates to respectively form first and second thermally-grown silicon dioxide ($SiO_2$) sub-spacers.

18. The method of claim 17, wherein forming said first and second dielectrics further comprises forming first and second silicon nitride ($Si_3N_4$) sub-spacers adjacent to said first and second thermally-grown silicon dioxide ($SiO_2$) sub-spacers.

19. The method of claim 11, further comprising forming a dielectric in between said floating gate and said third region of said channel.

20. The method of claim 19, wherein said dielectric comprises thermally-grown silicon dioxide.

* * * * *